(12) United States Patent
Jundt

(10) Patent No.: US 9,470,912 B2
(45) Date of Patent: Oct. 18, 2016

(54) CHEMICALLY REDUCED LITHIUM COMPOUND-BASED Q-SWITCH

(71) Applicant: Gooch and Housego PLC, Ilminster, Somerset (GB)

(72) Inventor: Dieter Hans Jundt, Palo Alto, CA (US)

(73) Assignee: Gooch and Housego PLC, Somerset (GB)

( * ) Notice: Subject to any disclaimer, the term of this patent is extended or adjusted under 35 U.S.C. 154(b) by 168 days.

(21) Appl. No.: 14/591,405

(22) Filed: Jan. 7, 2015

(65) Prior Publication Data

US 2015/0205147 A1 Jul. 23, 2015

Related U.S. Application Data

(60) Provisional application No. 61/928,834, filed on Jan. 17, 2014, provisional application No. 62/043,269, filed on Aug. 28, 2014.

(51) Int. Cl.
*G02F 1/03* (2006.01)
*G02F 1/00* (2006.01)
*H01S 5/00* (2006.01)
*C23C 22/00* (2006.01)

(52) U.S. Cl.
CPC .............. *G02F 1/0018* (2013.01); *G02F 1/03* (2013.01); *G02F 1/0305* (2013.01); *G02F 1/0311* (2013.01); *H01S 5/00* (2013.01); *C23C 22/00* (2013.01); *Y10T 29/49204* (2015.01)

(58) Field of Classification Search
CPC ...... G02F 1/0316; G02F 1/03; G02F 1/0018; G02F 1/0305; C23C 22/00
USPC ................ 359/245, 264; 372/10, 12; 29/874
See application file for complete search history.

(56) References Cited

U.S. PATENT DOCUMENTS

| | | | | |
|---|---|---|---|---|
| 3,900,246 A | * | 8/1975 | Kimura | G02F 1/0018 359/251 |
| 4,884,044 A | * | 11/1989 | Heywood | G02F 1/0305 359/245 |
| 6,031,809 A | * | 2/2000 | Ohba | G02F 1/0316 359/316 |
| 6,319,430 B1 | | 11/2001 | Bordui et al. | |
| 6,396,618 B1 | * | 5/2002 | Esener | G02F 1/0551 359/245 |
| 7,323,050 B2 | * | 1/2008 | Shiono | C30B 33/00 117/86 |
| 7,381,397 B2 | | 6/2008 | Jundt et al. | |
| 2004/0179775 A1 | | 9/2004 | Seguin et al. | |

FOREIGN PATENT DOCUMENTS

WO 0133260 5/2001

OTHER PUBLICATIONS

P. F. Bordui, et al., "Chemically reduced lithium niobate single crystals: Processing, properties and improved surface acoustic wave device fabrication and performance", Journal of Applied Physics, vol. 85, No. 7, Apr. 1, 1999, pp. 3766-3769.

* cited by examiner

*Primary Examiner* — Zachary Wilkes
(74) *Attorney, Agent, or Firm* — Jetter & Associates, P.A.

(57) ABSTRACT

A method for manufacturing Q-switches includes coating a first Z-surface and second Z-surface of an oriented slab of a chemically reducible electro-optic lithium compound crystal (LC slab) with a condensed material including an active chemical operable once activated to chemically reduce the LC. The LC slab with condensed material thereon is heated in a non-oxidizing atmosphere at a temperature above an activating temperature of the condensed material. The LC slab is cooled to a temperature below a quenching temperature below which re-oxidization of the LN slab is inhibited. A finishing process is performed including cutting the LC slab of LC into a plurality of Q-switch devices each having a chemically reduced LC substrate, and forming metal electrodes on opposing sides of the LC substrates that are orthogonal to the Z-surfaces, and coating the Z-surfaces with an antireflective (AR) coating material.

6 Claims, 8 Drawing Sheets

TIME AFTER PLACING SLAB (s)

CHEMICALLY REDUCED LITHIUM COMPOUND-BASED Q-SWITCH

CROSS REFERENCE TO RELATED APPLICATIONS

This application claims the benefit of Provisional Application Ser. No. 61/928,834 entitled "CHEMICALLY REDUCED LITHIUM NIOBATE Q-SWITCH", filed Jan. 17, 2014 and Provisional Application Serial No. 62/043,269 entitled "CHEMICALLY REDUCED LITHIUM NIOBATE Q-SWITCH", filed Aug. 28, 2014, and which are both herein incorporated by reference in their entireties.

FIELD

Disclosed embodiments relate generally to electro-optic Q-switches used in lasers, more particularly to Q-switches made from Lithium Niobate processing that aids in dissipation of pyro-electric surface charges on the optical faces.

BACKGROUND

To produce well controlled laser pulses in a laser cavity containing a gain medium with a long upper state lifetime, such as a Nd:YAG laser, an electro-optic Q-switch is often employed. One of the most commonly used crystal materials used for Q-switches is Lithium Niobate (LiNbO$_3$, hereafter LN) because it is commercially available in large sizes with good optical quality, making it a cost-effective choice.

An electro-optic Q-switch is placed inside the laser cavity and uses the Pockels effect in the crystal to change its refractive index with an applied voltage. A common implementation for a LN Q-switch has the laser mode propagating along the crystallographic Z-axis and applies the voltage along the X-faces of the Q-switch.

A laser relies on the optical field in the laser mode to stimulate emission of the upper level states in the gain medium. The Q-switch in the laser cavity is for spoiling (reducing) the Q-factor of the laser cavity, defined as the ratio of energy circulating in the laser mode to the energy lost per cavity round trip. In a Z-cut LN Q-switch, a voltage applied will induce a birefringence that makes the LN crystal act as a quarter-wave plate (or half-wave plate depending on the cavity design, i.e. other polarization elements), introducing loss and spoiling the Q-factor.

A typical sequence of events for generating a laser pulse starts with the voltage being applied to the Q-switch, followed by pumping the gain medium, increasing the density of upper state levels. Lasing will be prevented at that stage because the Q-switch induces enough loss to prevent the laser mode from building up energy. Once the gain medium is sufficiently pumped, the voltage applied to the Q-switch is eliminated. This removes the voltage-induced birefringence in the LN crystal, the laser cavity loss is reduced, increasing the Q-factor, and the laser pulse builds up to extract most of the stored energy in the upper energy level. A good Q-switch is characterized by a high loss induced under voltage and low insertion loss under a no-voltage condition.

However, LN is known for building up pyro-electric charges when undergoing a temperature change. These charges appear on the crystallographic Z-faces, which coincide with the optical faces in the typical LN Q-switch implementation. This can induce non-uniform internal electrical fields with field lines terminating on the electrical contacts. These fields lead to index of refraction changes. If the charges move around on the surface, the local non-uniformity in refractive index can become even higher.

The laser operation is affected by these pyro-charge induced electric fields in two ways: Under a no-voltage condition, the induced birefringence leads to some loss, lowering the total pulse energy. More importantly, particularly for high gain laser systems, the charges will adversely affect the hold-off under applied voltage. The charges lead to deviations away from the desired performance of a uniform wave plate. The LN crystal will not induce as much loss as desired, and this may lead to premature lasing before the voltage is switched off. This is typically called pre-lasing and in extreme cases leads to multiple laser pulses during the pumping phase of the gain medium. As a consequence, the pulse energy is poorly controlled and typically much lower than desired, and the timing of the pulses is also not well controlled.

The low intrinsic electrical conductivity of LN of about $1 \times 10^{-18}$ ohm$^{-1}$·cm$^{-1}$ at room temperature combined with LN's natural pyro-electric response can lead to significant static electrical surface charging following temperature changes to the LN crystal. The surface charge build-up can be ameliorated by various different approaches to dissipate the pyro-electric charges once they are produced by a temperature change.

Most disclosed approaches for enhancing charge dissipation for LN crystals rely on increasing the electrical conductivity of the LN crystal from its low intrinsic electrical conductivity level so that the electrical charges can more quickly dissipate. For example, doping has been investigated as to its effect on increasing the electrical conductivity of LN, but has not by itself yielded the required electrical conductivity increase. UV illumination has also been shown to increase the electrical conductivity of LN.

SUMMARY

This Summary is provided to introduce a brief selection of disclosed concepts in a simplified form that are further described below in the Detailed Description including the drawings provided. This Summary is not intended to limit the claimed subject matter's scope. Disclosed embodiments describe methods for manufacturing a Q-switch device and Q-switch devices therefrom that largely solve the above-described problem of surface charge build-up during Q-switch device operation by chemically reducing the Z-faces of electro-optic (EO) chemically reducible EO lithium compound Q-switches which have been found to significantly increase the electrical conductivity that increases the rate of dissipation of pyro-electrically induced charge on the crystal, while only causing a slight reduction in optical transmission in the LN crystal. The method generally comprises providing an oriented slab of a chemically reducible EO lithium compound crystal (a LC slab) including a first Z-surface and a second Z-surface opposite the first Z-surface. The LC slab can comprise Lithium Niobate (LN), Lithium Tantalate (LT) or other chemically reducible EO lithium compound crystal.

The first and second Z-surface are coated with a condensed material including at least one active chemical operable once activated to chemically reduce the LC. The LC slab is heated with the condensed material thereon in a non-oxidizing atmosphere at a temperature above an activating temperature of the condensed material. The LC slab is cooled to a temperature below a quenching temperature below which re-oxidization of the LC slab is inhibited. A finishing processing is performed including cutting the LC slab into a plurality of Q-switch devices each having a chemically reduced LC substrate. For each of the plurality of Q-switch devices, metal electrodes are formed on opposing sides of the LC substrate that are orthogonal to the first and second Z-surfaces, and the first Z-surface and second Z-surface of the LC substrate are coated with an antireflective (AR) coating.

Disclosed methods also include the optional step of annealing the first Z-surface and second Z-surface in a non-oxidizing atmosphere after the AR coating. This processing is based on the discovery that the AR coating process can destroy the benefit of disclosed chemical reduction of the LC material because the AR coating process conditions can re-oxidize a shallow layer under the AR coating (thus reversing chemical reduction of the LC material), particularly when the AR coating is a metal oxide coating.

BRIEF DESCRIPTION OF THE DRAWINGS

Reference will now be made to the accompanying drawings, which are not necessarily drawn to scale, wherein.

DETAILED DESCRIPTION

Figure 1:
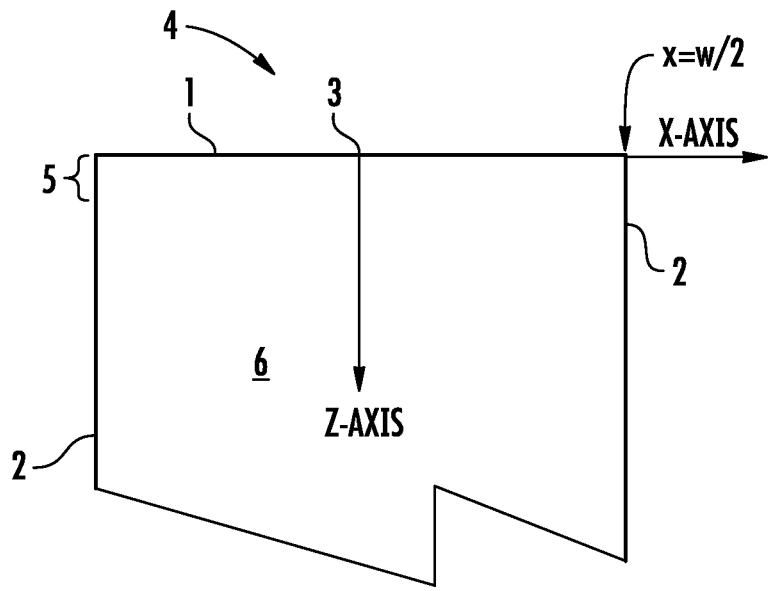
FIG. 1 shows a schematic cross-section of one end (−Z) of a Q-switch used to analyze charge dissipation resulting from an electrically conductive layer.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As described above, disclosed embodiments includes methods for chemically reducing the Z-faces of EO LC Q-switches that have been found to significantly increase the electrical conductivity which increases rate of dissipation of pyro-electrically induced charge on the LC crystal, while only causing a slight reduction in optical transmission in the LC crystal. The Q-switch device generally includes an AR coating on the Z-faces. The intrinsic electrical conductivity of LT is about $2\times10^{-15}$ ohm$^{-1}$·cm$^{-1}$ at room temperature while as described above the electrical conductivity of LN is about $1\times10^{-18}$ ohm$^{-1}$·cm$^{-1}$ at room temperature. The first Z-surface and second Z-surface include a surface layer under the AR coating which is generally chemically reduced to an extent to provide a 25° C. electrical conductivity that is at least ten thousand times ($10^4$) greater than an intrinsic electrical conductivity of the LC substrate. The thickness of the surface layer under the AR coating is generally <0.5 mm, typically being 0.1 mm to 0.5 mm.

A simple analytical solution is first derived that allows estimates on how these two factors relate to one another. The model is somewhat simplified as the actual LC crystal geometry and electrical conductivity change with crystal depth is not known.

The model however does highlight general trends that are valid for more realistic configurations. Actual device performance models can utilize Finite Element Analysis (FEA) which is expected to give more precise predictions, but at a loss of simplicity. Actual reduction profiles will deviate from the model assumptions, but the general conclusions including the general shape of the Figure of Merit curves, explained below, will largely remain the same.

A polaron is a quasiparticle used in condensed matter physics to describe the interactions between electrons and atoms in a solid material. A conduction electron in an ionic crystal or a semiconductor crystal is the prototype of a polaron. Chemically reduced LC is recognized to be more electrically conductive as compared to non-reduced LC (e.g., unprocessed LC) because of the presence of polarons that can move through the LC crystal lattice. Polarons are believed to be the dominant electrical conduction mechanism for the temperature range, with a typical specified operating range for Q-switches being from −55° C. to +85° C. (where Q-switches are normally operated). This electrical conductivity is temperature dependent and estimates of about 0.6 eV for the activation energy of LN have been published. The Inventor described herein has more accurately determined this activation energy of LN, as explained in Example 4 to 0.672±0.001 eV.

It is possible that this value can be further refined, for example if the activation energy is dependent on the degree of reduction. This may involve adjusting the conclusions and estimates contained herein. While this may change the particular values estimated (for e.g., the dissipation time constant at low temperature), it does not affect the general principle of the estimation or disclosed aspects. The bi-polarons not only give rise to electrical conductivity, they also cause a broadband absorption in LC. Both the electrical conductivity σ and the optical absorption coefficient α are proportional to the density of the polarons in a given crystal volume. Since the crystal during the reduction treatment can only interact, i.e. get chemically reduced, by the environment at the surface, the polaron density n is not homogeneous, but decreases from its maximal value at the surface (z=0) as the depth increases.

In the Inventor' experiments described below, it was found that assuming a reduction profile represented by a single exponential decay with depth yields reasonable approximations to the observed profile. With that assumed profile, the depth dependence can be calculated for the polaron density and thus for both the conductivity and the absorption according to Eq. 1 shown below. Note that for a given laser wavelength, the proportionality constants $\sigma_0/n_0$ and $\alpha_0/n_0$ have fixed ratios, independent of the strength of reduction $n_0$ at the surface or the value a for the profile depth.

$$n(z) = n_0 e^{-z/a}$$

$$\sigma(z) = \sigma_0 e^{-z/a} = (\sigma_0/n_0) \times n(z)$$

$$\alpha(z) = \alpha_0 e^{-z/a} = (\alpha_0/n_0) \times n(z) \quad (1)$$

The actual reduction profile may deviate from this (ideal and analytically solvable) profile. The shape of the profile close to the surface may differ significantly and the tail may observe sub-exponential or Gaussian behavior. The major conclusions however will apply even with those deviations present. The profile close to the surface will be removed in subsequent steps, and the profile far away from the surface is less significant. The profile will still have a characteristic depth a and one generally can define this depth as the increase in depth necessary to reduce the magnitude of the conductivity by 1/e, where e is Euler's number.

The section describes estimating the optical IL at the operating laser wavelength and also estimating the strength or speed of charge dissipation. For mathematical convenience, a steady-state solution is used where the LC Q-switch is being cooled at constant rate. This induces surface charges on the Z-faces at a constant rate. The charge density generated on the opposite sides of the crystal have opposite sign, and the rate of charge surface creation is given by Eq. 2 below:

$$\frac{dC}{dt} = p \times \frac{dT}{dt}. \quad (2)$$

where C is the charge density on the surface, T the temperature, and p the material-dependent pyroelectric coefficient. In the case of congruent LN, this material constant is about $-10.4 \times 10^{-5}$ C/m$^2$/K. The charge density is created uniformly across the optical Z-surfaces. Unless there is some conduction path that dissipates the electrical charges, the charge density will increase as the crystal is cooled, leading to index of refraction distortions and possibly discharge arcing. It is assumed for the model used that the electrical conductivity close to the surfaces is sufficient to achieve a steady-state discharge balancing the generation of new charges. This is always generally possible for non-zero conductivity for very small cooling rates. In this steady-state case, the generated charge density is constant in time and dissipates through the material at the same rate, with an electric current density j equal to the expression given in Eq. 2.

There is an equal current, but of opposite sign, on the opposite end of the Q-switch, and only one is needed for consideration, e.g. the −Z face in the analysis. For that surface, the cooling will create positive charges, and a uniform current density on the surface. This current will get conducted predominantly to the electroded X-faces. For the analysis, it is assumed the Y-faces are perfectly insulated, and the X-faces are at zero potential. This assumption is reasonable because the configuration of interest has no voltage applied to the electrodes. These assumptions reduce the dimensionality of the model to the x- and z-dimension.

The geometry considered for the analysis is shown in FIG. 1 as LC device 4. The LC device 4 comprises an LC crystal 6 having a polished crystal Z-face 1 on which the pyro-induced current is injected, and the orthogonal metalized X-faces 2 sink the current. The chosen coordinate system (x, z) has origin at point 3 which lies at the center of the Z-face 1. Also indicated is a layer thickness 5 where it is expected most of the current to flow, in proximity to the Z-face 1. The width of the LC Q-switch 4 is denoted as w.

The steady-state is described by the two-dimensional Laplace equation in Eq. 3 explicitly allows for depth-dependent electrical conductivity. The electric field inside the LC crystal 6 is given by $E=-\nabla\phi$; the negative gradient of the potential (Voltage) which satisfies the equation given by Eq. 3 below:

$$\nabla[\sigma(z)\nabla\phi] = 0. \quad (3)$$

The injected current needs to satisfy Ohm's law inside the LC crystal 6 which leads to the boundary condition $j=-\partial\phi/\partial z \sigma_0$ at the Z face 1. The potential needs to vanish on metalized X-faces 2 ($x=\pm w/2$) as they are grounded by the power supply, and it also needs to vanish for $z\to\infty$. Using a separation of variables approach with the Ansatz $\phi(x, z) = A(x)B(z)$ leads to the two equations for A and B given by Eqs. 4 below where $k^2$ denotes the constant of separation.

$$\frac{\partial^2 A}{\partial x^2} = -k^2 A \quad (4)$$

$$\frac{\partial^2 B}{\partial z^2} - \frac{1}{a}\frac{\partial B}{\partial z} = k^2 B$$

The boundary conditions at metalized X-faces 2 limit the solutions for A to symmetric (cosine) solutions with specific values for $k^2$ and $i \geq 0$ given by Eq. 5 below:

$$A_i = \sqrt{\frac{2}{w}} \cos(k_i x) \quad (5)$$

$$k_i = (2i+1)\pi/w.$$

These functions form an orthonormal base in x. The corresponding solution for B is given by Eq. 6 below:

$$B_i = \exp(-z(g_i - 1/2a)) \quad (6)$$

$$g_i = \sqrt{\left(\frac{1}{2a}\right)^2 + k_i^2} > 1/2a$$

The general solution for the potential is given by Eq. 7 below by a sum with coefficients $c_i$ $$\phi = \sum_{i \geq 0} c_i A_i(x) B_i(z) \tag{7}$$

The coefficients are defined by the injected current boundary condition at the Z face 1 given by Eq. 8 below.

$$-\frac{j}{\sigma_0} = \frac{\partial \phi}{\partial z}\bigg|_{z=0} = \sum_{i \geq 0} c_i A_i(x) \frac{\partial B_i}{\partial z}\bigg|_{z=0} = \sum_{i \geq 0} c_i A_i(x) \frac{1 - 2ag_i}{2a}. \tag{8}$$

This allows calculating the coefficients c, given by Eq. 9 below as:

$$c_i = (-1)^i \frac{j}{\sigma_0} \sqrt{\frac{2}{w}} \frac{1}{k_i} \frac{4a}{2ag_i - 1}. \tag{9}$$

Eq. (7) with the constants defined in Eqs. (5, 6, 9) describe the voltage potential anywhere in the LC crystal 6 under the assumption that the electrical conductivity profile is given by (1) and the cooling rate is slow enough to result in a constant current being injected into the LC crystal 6.

Several observations can be made. First, the voltage is highest in the middle of the Z face, at point 3 shown in FIG. 1. Second, the voltage everywhere is proportional to the injected current density as well as the inverse of the material conductivity (assuming constant depth a). The current density in turn is proportional to the cooling rate. To compare the charge dissipation of various crystals with different conductivity profiles, one wants to minimize the magnitude of this voltage because the electro-optic effect is directly proportional to it and the undesirable effects on extinction ratio are a result of index of refraction changes.

From this analysis, one can conclude that a highly conductive LC crystal is best suited as it quickly conducts away the electrical charges and does not allow a substantial voltage build up. The maximal voltage at point 3 shown in FIG. 1 can be calculated given by Eq. 10 below by noting that $A_i = \sqrt{2/w}$ and $B_i = 1$ at z=x=0 to yield:

$$\phi(0, 0) = \frac{j}{w} \frac{8a}{\sigma_0} \sum_{i \geq 0} \frac{(-1)^i}{k_i \left( \sqrt{(1 + (2ak_i)^2)} - 1 \right)}. \tag{10}$$

A high electrical conductivity, while aiding the charge dissipation, also leads to optical absorption. As stated in Eq. 1 above, the electrical conductivity and optical absorption are strictly linked. Since both of those material properties change with the depth a of the reduction profile, there is a tradeoff between the desirable (low voltage due to high electrical conductivity) and undesirable effects (high optical absorption) to be determined. The absorption profile attenuates the laser light propagating through the crystal. It is generally straightforward to integrate the partial differential equation, $dI/dz = -\alpha(z)I$ for the intensity of the laser light as it propagates through layer thickness 5 to yield Eq. 11 below:

$$I = I_0 \exp(a\alpha_0(e^{-z/a} - 1)). \tag{11}$$

The intensity of the laser light is maximal at z=0 and decreases as the laser propagates into the depth (thickness) of the material. After propagating a distance large compared to the diffusion depth a, the incident intensity $I_0$ has decreases to value $I_0 \exp(-a\alpha_0)$ and no longer changes with depth. The total attenuation of the laser beam passing through the whole LN crystal is roughly twice that because both ends are assumed to be equally treated and attenuate the laser equally. More precisely, one can write the IL given by Eq. 12 below as a function of the absorption profile:

$$IL = 1 - [\exp(-a\alpha_0)]^2 = 1 - \exp(-2a\alpha_0) \approx 2a\alpha_0 \tag{12}$$

Where an approximation has been made for small arguments in the exponent because the IL needs to be small in practice for the crystal to be useful as a Q-switch.

The FM for a chemically reduced Q-switch can be defined given by Eq. 13 below as the inverse of the product of the laser wavelength IL and the maximal voltage for a normalized injection current (or cooling rate).

$$FM = j/(\phi(0,0) \times IL). \tag{13}$$

Figure 2:
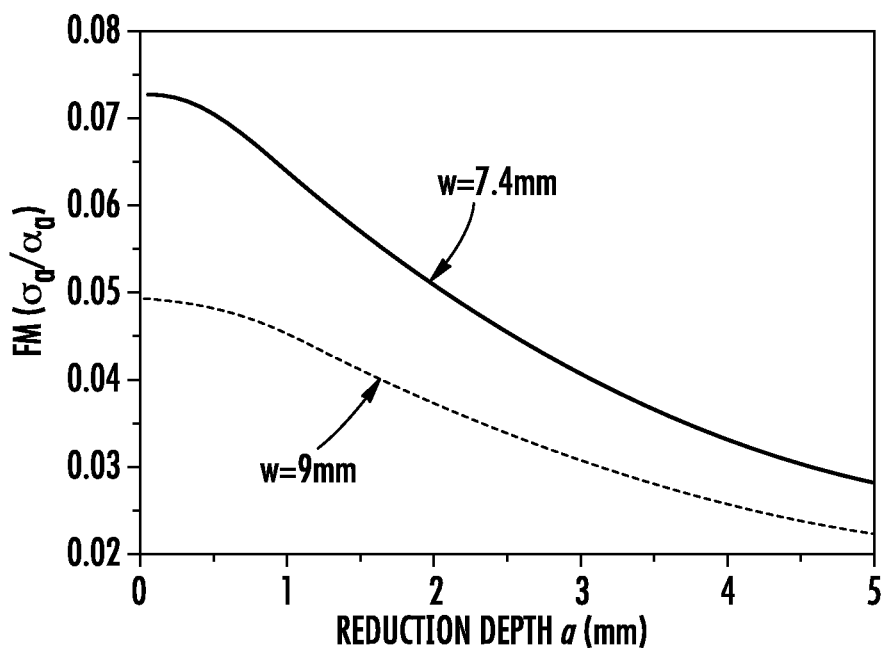
FIG. 2 shows the Figure of Merit (FM) as defined below as a function of reduction layer depth with two representative Q-switch (w) dimensions shown.

Inserting the result of Eq. (10) and (12), results in Eq. 14 below:

$$FM = \frac{w}{16a^2} \frac{\sigma_0}{\alpha_0} \left\{ \sum_{i \geq 0} \frac{(-1)^i}{k_i \left( \sqrt{(1 + (2ak_i)^2)} - 1 \right)} \right\}^{-1} \tag{14}$$

where use has been made of the approximation for small loss. The FM depends on the ratio of $\sigma_0$ and $\alpha_0$ which is a material constant for a given wavelength and not dependent on the strength, depth or shape of the reduction profile. The only other variables affecting FOM are geometric factors depending on the Q-switch width w and the reduction depth a. FIG. 2 shows the FM calculated by Eq. 14 for two common Q-switch geometries shown as w=7.4 and w=9.0 mm.

The model described herein can be extended to model the charge decay dynamics of an existing surface charge at constant temperature. Such calculations are generally relevant in practice for a Q-switch that has reached the target temperature and surface charges remain on the Z-surfaces. The charge components with a higher spatial frequency $k_i$ will decay away more quickly and the overall charge decay time of the device is governed by the lowest spatial frequency i=0. It follows from Eq. 10 that the charge decay will approach an exponential decay for long times and the charge decay time constant is proportional to $w^2/(\alpha\sigma_0)$, where Eq. 10 defines the term charge decay time constant as used herein. The product of the diffusion depth and the surface conductivity can be interpreted as sheet conductivity for the diffusion layer, and it makes intuitive sense that the decay will be faster for either a shorter distance over which the charges flow or an increased sheet conductivity. This model allows the calculation of charge dissipation dynamics of an actual Q-switch device if the conductivity profile for the device is known.

Disclosed embodiments recognize the influence of surface finishing on the reduction profile for LC crystals. One disclosed embodiment processes slabs of Z-axis orientation and subsequently may rework those surfaces by lapping and polishing before the AR coatings are applied. The reduction is not uniform throughout the slab but most pronounced at the surface. Below, the effect such surface material removal has on the FM is reviewed.

It is a general property of single exponential decay functions that shifting the origin $z' = z + \Delta z$ can also be described as a diminishing in the surface reduction strength $\sigma_0$ (or $\alpha_0$) while keeping the reduction depth a unaltered. Under this assumption, the final reduction profile for a given characteristic depth a can be achieved in a variety of ways: instead of weaker surface reduction, a crystal can also be processed more aggressively with subsequent higher polish removal $\Delta z$ to achieve the same surface reduction strength. The crystal reduction depth a depends on the temperature (and time) as is well known from diffusion science. The temperature is a much stronger influence than the process duration, and it is generally more convenient to adjust the temperature to effect a change in reduction depth than to adjust the dwell time. Practical reduction profiles will deviate slightly from a single exponential, but the model presented here is a good starting point to plan an optimization matrix where the strength of reduction (temperature, time, active compound density etc.) and removal thickness after processing are altered to achieve a high layer conductivity while keeping optical IL at an acceptable level.

In practice and as used herein, the IL of a Q-switch refers to a placing the Q-switch in front of a laser beam having the wavelength of interest and measuring the optical power falling onto the aperture of the Q-switch and also transmitted through the Q-switch, where the IL is the fraction of incoming optical power that is not measured in the transmitted beam because it is either reflected, scattered, or absorbed by the Q-switch. Although in this disclosure only absorption losses are discussed, such as IL defined as a function of absorption in Eq. 12 shown above, it is generally straightforward to add the generally smaller magnitude reflection loss and scatter loss to arrive at a more general IL expression.

Figure 3:
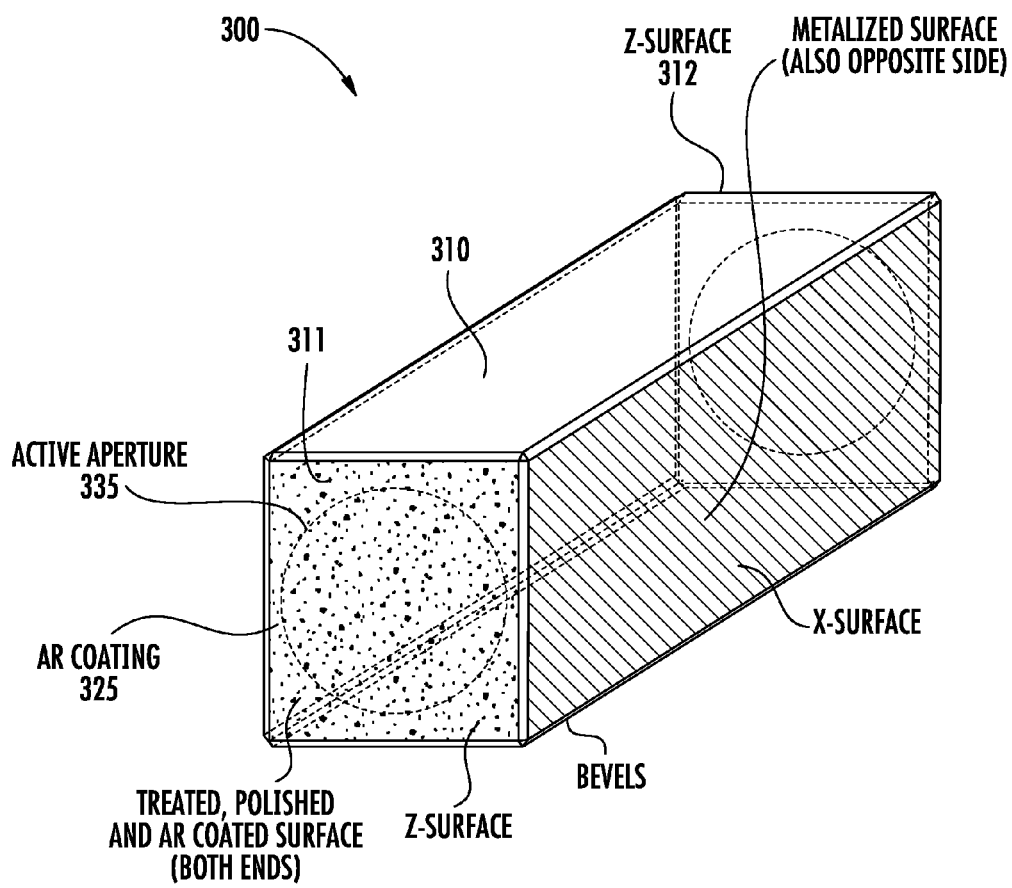
FIG. 3 is a depiction of an example electro-optic LC Q-switch with disclosed chemically reduced Z-faces, according to an example embodiment.

FIG. 3 is a depiction of an example electro-optic LC Q-switch 300 having disclosed chemically reduced Z-faces, according to an example embodiment. Q-switch 300 includes a LC substrate 310. The LC substrate 310 includes a chemically reduced first Z-surface 311 and chemically reduced second Z-surface 312 opposite the first Z-surface 311. Metal electrodes provided by a metal layer (e.g., gold) are on opposing X-surfaces of the LC substrate 310, thus being positioned orthogonal to the Z-surfaces 311, 312.

An AR coating 325 is on the Z-surfaces 311 and 312. Disclosed Z-surfaces have a significantly reduced variation in IL across the area of active aperture 335 of the Q-switch device 300 compared to known Q-switch devices (see FIG. 8 described below) and have a charge decay time constant shorter than 1 hour at −20° C., which together evidence a significant and uniform chemical reduction of the Z-surfaces 311, 312 of the LC substrate 310. As used herein "IL uniformity" for Z-surfaces is defined as $\Delta IL=(max(IL)-min(IL))/IL_{ctr}$, where $IL_{ctr}$ stands for IL at the center of the active aperture, and the max and min are the maxima and minima IL measured anywhere on the optical aperture with a beam size of at least 0.1 mm and smaller than 0.25 times a size of the active aperture so that the plurality of IL measurements do not overlap one another or the IL measurement at the center and sample, at there are least 2 locations within each quadrant of the active aperture. For an example 6 mm diameter active aperture, the beam size for Il measurements for calculating $\Delta IL$ can be between 0.1 mm and 0.5 mm, and the at least 9 Il measurements can be performed including one at the center of the active aperture and 8 other IL measurements that do not overlap one another or the IL measurement at the center for sampling IL at least 2 locations within each quadrant of the active aperture. Disclosed Q-switch devices generally provide a $\Delta IL$ of <0.5, with $\Delta IL$ generally being <0.1 (with noise in the measurement generally making it difficult to determine a true IL value at a level of about 0.1 or lower).

By measuring both the absorption and the electrical conductivity of a heavily reduced LN sample, a proportionality constant $\alpha$ was determined between the absorption at 633 nm and the room temperature electrical conductivity to about $\sigma(25° C.)/\alpha(633 \text{ nm})=2\times10^{-11}/\text{ohm}$. The range of typically observed absorption values of 0.5 to 3 $\text{cm}^{-1}$ therefore corresponds to a room-temperature bulk electrical conductivity of the LN material in the conductive layer of about $1\times10^{-11}$ to $6\times10^{-11}$ $\text{ohm}^{-1}\cdot\text{cm}^{-1}$.

Figure 4:
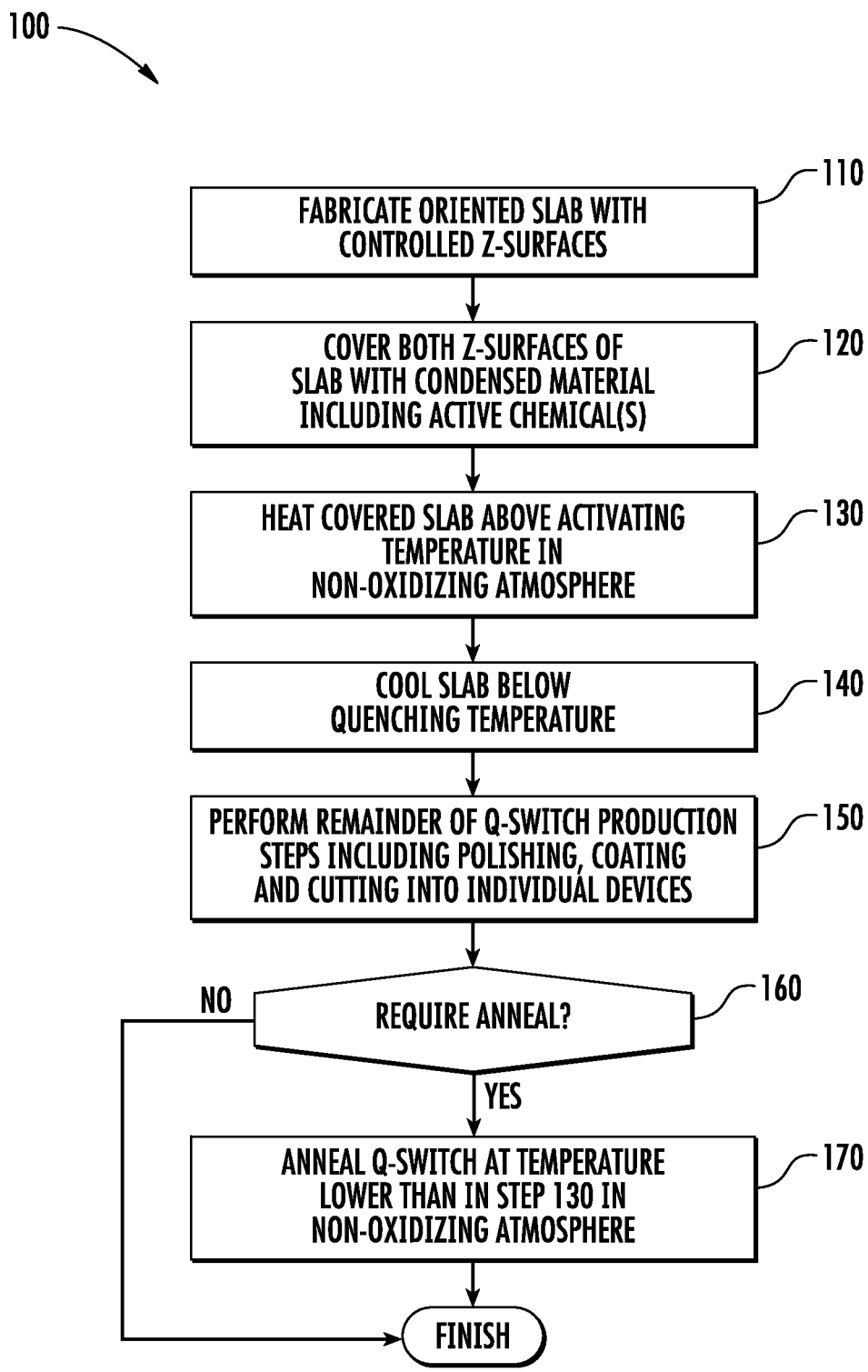
FIG. 4 shows steps in an example method for producing a disclosed chemically reduced LC Q-switch with a disclosed reduction profile, according to an example embodiment.

FIG. 4 illustrates steps in an example method 100 for producing a chemically reduced LC Q-switch with a disclosed reduction profile. A LN single crystal can be grown, for example, by the Czochralski techniques. After growth and a poling step in which the LC crystal is rendered into a single-domain state, method 100 is applied. The LC crystal can be a doped crystal, such as with a dopant such as MgO that increases the resistance to photo-refractive damage.

In step 110, the LC crystal is oriented, such as by X-ray orientation, and cut to produce a slab with an increased dimension along the crystallographic Z-axis to allow for material removal on the respective Z-surfaces in subsequent step 150. The removal amount on both Z-surfaces will generally determine the finished device length. In Example 3 described below, 0.86 mm was removed from each Z-surface side, so that the slab was 1.72 mm thicker than the finished length. A typical removal amount per Z-surface is below 0.3 mm, so that the slab should generally be no more than 0.6 mm longer than that of the finished Q-switch device length. A slab is understood herein to be thicker than a wafer, typically more than 3 mm and often tens of mm in thickness. The dimension of the slab in both the crystallographic X- and Y-directions is a multiple of the thickness of the slab.

The Z-surfaces can be further conditioned by removal processing such as lapping, etching and polishing, or any combination thereof. Lapping is typically performed with a SiC or Alumina (or other high hardness material) grit, etching with HF or ammonium fluoride solutions, and polishing with compounds or slurries such as colloidal silica, cerium oxide and diamond suspensions. This processing is used to maintain or improve the orientation alignment accuracy of the surface normal with the crystallographic Z-axis while at the same time providing a consistent and reproducible surface roughness for subsequent steps of method 100. Step 110 generates an LC slab with Z-surfaces that have roughness, flatness, and alignment accuracy that are controlled within limits to ensure consistent processing in subsequent steps.

In one embodiment, the Z-surfaces are lapped with an alumina grit that has a median particle size of about 6 μm. The total thickness variation of the two faces across the slab surface is generally kept below 5 μm for this step with a wedge angle of generally less than 2 minutes across typical slab diameter of 100 mm. Each surface normal is generally aligned to the Z-axis≤5 minutes. The surface roughness has a typical rms value of 2 μm ($S_q$ value) or a typical arithmetic mean height value of 1.4 μm ($S_a$ value).

In step 120, both Z-surfaces of the LC slab are covered with a condensed material including at least one active chemical. The condensed material can be in a solid or a liquid phase. In one implementation, the condensed material is deposited on the surface of the crystal as a thin film. For example, the condensed material can be applied to the LC crystal's surface by dip coating, spin coating or physical vapor deposition. In one implementation, the condensed material is deposited on a particular portion of the crystal's surface, for example, after covering the surface of the crystal with a mask patterned to define the particular surface portion. Alternatively, the condensed material can be a powder that covers a surface of the LC crystal.

For depositing a film on the crystal's surface, the active chemicals can be dissolved or dispersed in a liquid matrix. In one implementation, the liquid matrix is relatively inert, gas permeable and has a viscosity that can be adjusted to achieve uniform suspension of the active chemicals or to enhance a spin-on process used to coat the crystal's surface. For example, the film can be deposited using a gas permeable spin-on glass such as ACCUGLASS®125T-12B available from Honeywell Electronic Materials of Sunnyvale, Calif. This matrix may be uniformly applied in a mass production setting using established spin-coating and thermal curing methods. The condensed material includes active chemicals that contribute to reducing the crystal. The condensed material can also include one or more inert components. For example, the active chemicals can be dissolved in an inert solvent, and the solution can be spun on the surface of the crystal. Alternatively, the active chemicals can be dispersed in a liquid matrix, and the dispersion deposited on the surface of the crystal.

Above the activating temperature of the condensed material the active chemicals contribute to chemically reducing the LC crystal beneath the surface covered with the condensed material. For example, the active chemicals can participate in a reducing reaction that chemically reduces the LC crystal. The reducing reaction can include a series of chemical reactions, and the active chemical can participate in one or more of the chemical reactions. The active chemicals can participate directly or indirectly in a reaction that reduces the LC crystal. For example, the active chemicals can participate in a reaction whose reaction product reduces the crystal, or the reaction product can interact with the reducing atmosphere to reduce the LC crystal. The active chemicals can also act as catalyzers that, without being chemically changed, accelerate the rate of the crystal's chemical reduction.

In one implementation, the active chemicals include reducing agents that are materials that typically become oxidized (that is, lose electrons) in chemical reactions. Examples of reducing agents include hydrides, such as lithium hydride (LiH) or calcium hydride ($CaH_2$), which have been found to effectively reduce LC crystals. Other hydrides, such as aluminum hydride ($AlH_3$) or lithium-aluminum hydride 5 ($LiAlH_4$) can also be used for reducing LC crystals.

In alternative implementations, the active chemicals can include carbonates, such as lithium carbonate ($Li_2CO_3$), potassium carbonate ($K_2CO_3$), calcium carbonate ($CaCO_3$), and magnesium carbonate ($MgCO_3$). The active chemicals can also include bicarbonates, such as sodium bicarbonate ($NaHCO_3$).

In other alternative implementations, the active chemicals can include oxalates, such as lithium oxalate ($Li_2C_2O_4$), or oxalates of sodium ($Na_2C_2O_4$), potassium ($K_2C_2O_4$), magnesium ($MgC_2O_4$) or calcium ($CaC_2O_4$).

Step 130 comprises heating the covered LC slab above the activating temperature of the condensed material in a non-oxidizing atmosphere. The heat treatment in step 130 is typically performed at a processing temperature higher than 370° C., but lower than 550° C. for a duration of tens of minutes to a several hours. The atmosphere should be essentially free of oxygen as oxygen can suppress the reduction process. A straightforward way to implement this is to flow a forming gas mixture ($H_2$ and $N_2$) through the sealed furnace chamber. The reduction process is believed to not only involve the active chemical interacting with the LC crystal and the atmosphere, but also the charge carriers (e- and charge-compensating cations, most likely $Li^+$) diffusing into the LC crystal. Although the reduction mechanism described above, or any other mechanism described herein, is (are) believed to be accurate, disclosed embodiments may be practiced independent of the particular mechanism(s) that may actually be operable.

As noted above, in one implementation, the non-oxidizing atmosphere uses forming gas. The hydrogen will react with oxygen at or above the activation energy to form water vapor. A steady gas flow ensures the all reaction products are carried away. After the LC slab has been processed at the processing temperature for a given duration, the sample is cooled down in step 140. This is typically achieved by cooling down the furnace, either naturally or by active cooling. Other implementations may use a transport mechanism that pulls the LC slab through a region with moderate thermal gradient to a section of the furnace below the quenching temperature. After the slab reaches the quenching temperature, re-oxidization of the LC slab can be inhibited because the temperature is too low to allow the reaction even if oxygen is present in the atmosphere. The gas flow may then be turned off and the slab unloaded from the furnace. To prevent the slab from cracking after removal from the furnace, the quenching temperature is typically chosen below about 100° C. The resulting slab after step 140 has a reduction profile with highest conductivity at the surface and diminishing conductivity with increasing depth from the surface. This conductivity profile, or reduction profile, is largely uniform across the surface of the LC slab.

In step 150 of method 100, a finishing processing is applied to the LC slab. The finishing processing produces one or more finished devices by performing a series of steps. Depending on the surface condition achieved by step 110, the Z-surfaces may receive more or less surface removal. The treated Z-surfaces may be lapped and polished again to remove any damage induced in step 130. Such damage may manifest itself as pits on the Z-surfaces. A polishing step alone is often sufficient for this removal of damage, involving a removal depth of less than 0.02 mm. If the amount of damage in the LC slab after completing step 140 is acceptable, no further lapping or polishing is necessary and the AR coating can directly be applied to the cleaned surface. The processes contained in the finishing processing step 150 include cutting into individual devices, AR coating of the Z-surfaces, as well as metal coating of the X-faces.

The order of steps contained in this finishing processing can be arranged in a variety of orders. For example, the cutting into individual cells for example can happen before any of the other steps, or after polishing and possibly anti-reflection coating the optical surfaces. The crystallographic X-faces and Y-faces can be left in the as-cut state or lapped. The metallization of the X-faces generally needs to be done after these faces are cut, but can be done before cutting the Y-faces and/or finishing of the Z-faces.

In step 160 of method 100, a decision is made whether the Q-switch should undergo step 170 in order to reverse a possible re-oxidization that may have happened in step 150. If such a re-oxidization occurred, it may be the result of a chemical reaction of the polishing slurry with the LC surface, or it may have occurred during the AR coating process that typically involves deposition of metal oxides which include oxygen gas that can cause oxidation of the LC surface. All of the processing in step 150 generally involve sample temperatures well below the activation or processing temperature for step 130. The layer thickness where re-oxidization possibly can happen therefore is very shallow compared to the diffusion depth for step 130, generally being about 1 μm to 5 μm. The decision of step 160 may be based on performance measurements of a representative sample for a particular set of processing conditions. In other implementations of method 100, a decision to perform the annealing step 170 may be made irrespective of the belief that the Q-switches have re-oxidized surface layers.

In case it is decided that step 170 should be performed, the cleaned Q-switch is heat treated in non-oxidizing atmosphere a second time. This can be done in the same furnace used for step 130 and 140, or in a different furnace. Since the surfaces of the Q-switch are already polished and have the Z-surfaces AR coated, a clean environment is advisable for this process step to avoid contamination or scratching of the optical surfaces. The smaller size of the Q-switch as compared to the slab of step 130 allows faster ramp rates for this annealing step. The atmosphere can be chosen the same as in step 130, such as forming gas. The processing temperature in this step should generally be lower by 50° C. or more compared to the processing temperature in step 130, and the dwell time should generally be equal or shorter than in step 130.

Using the estimated activation energy of 1 eV of Example 1 below, this provides a diffusion depth estimate smaller by a factor of three or more as compared to that of the original processing in step 130. The profile resulting from step 130 therefore is not altered significantly. The anneal process temperature for step 170 should generally be chosen high enough for the diffusion depth to exceed the shallow thickness of the re-oxidized layer, should such a layer exist. This can be ensured by choosing this anneal temperature higher by 50° C. or more than any temperature experienced by the Q-switch during steps 150. While it is possible that this annealing step creates additional charge carriers of the Q-switch, this is not necessary as the charge carriers required for the reduction of the shallow, re-oxidized layer can be provided by lower lying portions of the reduction profile created in step 130.

Still referring to FIG. 4, the reduction profile, including depth a achieved in method 100 is influenced by steps 110 through 130. The surface condition of the Z-surfaces prepared in step 110 can affect how much of the active ingredient will adhere to the surface in step 120. In the case of a spin-coating application, a smoother surface will result in a smaller film thickness. Similarly, the spin velocity will affect the film thickness as will the viscosity of the spin-on solution or suspension. Other than the deposited film thickness, the amount of active chemical deposited on the surfaces will depend on the concentration of active chemical in the applied material. Keeping all other parameters the same, more active material deposited will result in a higher surface conductivity $\sigma_0$. The temperature ramp (rate, duration) of step 130 will also affect the profile. Higher temperature or a longer processing duration result in increased depth a of the profile and also affect the surface electrical conductivity.

The amount of material removed in step 150 will not generally alter the profile achieved in previous process steps, but it will remove the surface layer. It therefore is generally important to control the material removal in step 150 carefully to provide uniformity across the LN slab and roughly equal removal on both sides. A small removal depth in step 150 will result in a more electrically conductive Q-switch. To get a high FM, the characteristic reduction profile depth a should be generally chosen to be small compared to the width w according to FIG. 2. There is some processing uncertainty in material removal depth however, giving variability in the finished device surface conductivity $\sigma_0$. This variability can be kept acceptably small if the removal uncertainty is small compared to the characteristic diffusion depth a. This is easier to achieve for a larger depth.

One can see from this that the achieved surface conductivity, the characteristic profile depth and the removal depth should be designed together to yield consistent reduction profile after re-polishing the LN surfaces. The selected values will depend on various factors, among them the removal depth necessary to achieve an optical quality surface and how tightly this removal depth can be controlled.

EXAMPLES

Disclosed embodiments are further illustrated by the following specific Examples, which should not be construed as limiting the scope or content of this Disclosure in any way. For example, the LC material is described in the examples as always being LN, but as described above the LC material can be LT or another EO lithium compound.

To determine the temperature dependence of this conductivity mechanism, a sample was prepared as follows: an as-lapped, Z-orientation, 100 mm diameter LN wafer was spun with the solution described in Example 1 below. The wafer was then processed at 475° C., also following the method described in Example 1. This was followed by a polishing step that removed between 0.03 mm and 0.05 mm from the treated surface. Five inter-digital electrodes fingers were then deposited on the surface with a finger spacing of 1.3 mm and the inter-digital overlap length of 17 mm. Three of the fingers were connected together on one side, the other two on the other side. This provides a Q-switch device where a voltage can be applied so the electrical conductivity of the sample volume between neighboring fingers can be examined.

Figure 5:
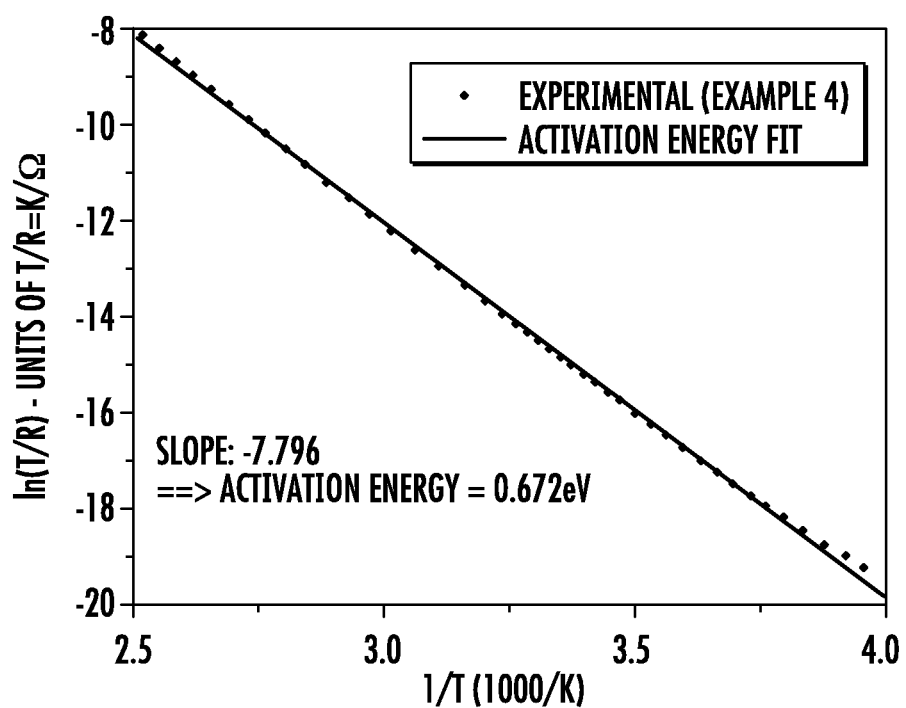
FIG. 5 shows the natural log ($1n$) of the product of temperature and conductance as a function of inverse temperature, together with the best fit linear dependence to determine the activation energy.

A square-wave voltage signal of amplitude of either 50 V or 500V and period of 1 minute was applied while the sample's temperature was ramped across the range from −20° C. to +100° C. When cooling, the sample was placed under vacuum to avoid condensation. The current was measured using a Keithley Instruments model 486 Picoammeter and the sample conductance was calculated as the ratio of current 20 s after each voltage change divided by the voltage. The ln of the product of absolute temperature and conductance is expected to change linearly with the inverse absolute temperature according to theories of conductivity in the references cited above. This linear dependence was confirmed as shown in FIG. 5 which shows the ln of the product of temperature and conductance as a function of inverse temperature, together with the best fit linear dependence to determine the activation energy, and the activation energy determined by a fit to 0.672±0.001 eV. The sample evaluated was quite dark with an IL of 11% at wavelength of 1064 nm.

Example 1

3 LN slabs were cut from a Z-grown crystal of diameter 105 mm. The thickness of the slabs after lapping one Z-surface with 9 micron size alumina grit was 4.8 mm. Only one surface was processed in order to measure the reduction depth profile at that surface and the opposite surface provides a control (unlapped) surface. A spin-on solution was prepared as follows: 25 g of lithium oxalate ($Li_2C_2O_4$) and 15 g of the surfactant SDS (sodium dodecyl sulfate, ($NaC_{12}H_{25}SO_4$) were dissolved in 650 ml of de-ionized water. Lithium oxalate is the active ingredient and SDS improves wettability. The viscosity of the solution was increased (to achieve thicker film thickness) by adding four parts by weight of store-bought liquid soap (Target Stores, item 049-00-1132) to six parts of the solution, followed by filtering the mixture using cellulose grade 3 filters. The resulting solution had a viscosity of around 3 cStokes. The ingredients of this solution can be altered in order to achieve different viscosities, drying rates and/or active ingredient concentrations. The three LN slabs were spin-coated at 1000 rpm, and the film subsequently dried by placing the slabs into a convection oven at 90° C. for a few minutes.

The slabs were subsequently processed individually at processing temperatures of 430° C., 460° C., and 480° C. as follows: One slab to be processed was placed onto fused silica furnace furniture and inserted into the center of a horizontal tube furnace. The fused silica tube has O-ring seals at both ends to ensure a well controlled atmosphere. After the sample and the thermal shielding were inserted into the furnace, the loading end-cap, also O-ring sealed, was attached and tightened. Gas flow through the furnace was then initiated. The gas mixture was 3.5% hydrogen in 96.5% nitrogen and the flow rate was controlled to 1.0 l/min. The furnace program was then started, heating up to the process temperature within 2 hours, holding the temperature constant for 100 minutes, and then letting the furnace cool down. When the furnace had cooled below about 80° C., the slab was unloaded.

Figure 6:
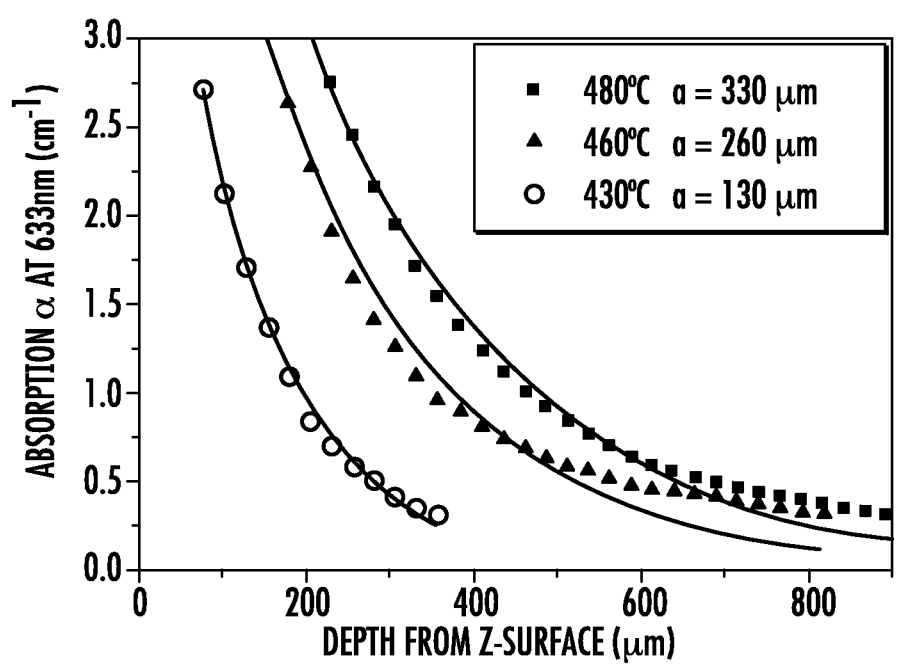
FIG. 6 shows optical absorption profiles as a function of depth from a Z-surface for LN slabs processed according to disclosed methods.

A sample was cut out from each LN slab and a cross-section polished with the optical direction along the X-axis. A laser operating at about 633 nm was focused through the sample, and the optical transmission at that wavelength was measured as a function of distance from the treated (lapped) Z-surface by moving the sample across the beam. The absorption can easily be calculated using Beer's law. The results are shown in FIG. 6 which shows optical absorption profiles as a function of depth from a Z-surface for LN slabs processed according to disclosed methods, together with the curves for best fit to Eq. (1). The legend indicates the best fit parameter values for a. As stated above, the absorption is proportional to the conductivity so the profile shown is representative for the conductivity profile as well. Similarly, according to Eq. (1), the absorption values at 633 nm are proportional to those at other wavelengths. The proportionality constants were experimentally determined on a series of processed wafers to $\alpha(1064\ nm)/\alpha(633\ nm)=0.23$ and $\alpha(1064\ nm)/\alpha(532\ nm)=0.20$. Optical IL can be evaluated at a wavelength with higher absorption where errors are smaller and the proportionality constants can then be used to convert to an expected IL at the laser wavelength, e.g. 1064 nm.

Examination of the data in FIG. 6 shows that the actual profile reaches somewhat deeper into the crystal than the single exponential fit or an error function often used to approximate diffusion profiles would imply. This is likely an effect of the diffusion speed being a function of the degree of reduction and surface effects such as depletion of the active chemical at the surface. The profile however does show the overall expected shape with depth, i.e. monotonous decreasing, concave function approaching a value of zero for large depths. If one fits the characteristic reduction profile depth a to an Arrhenius equation, the activation energy for this example is about 1 eV, similar to values reported in the literature.

Example 2

To obtain an idea of the charge dissipation dynamics for certain reduction profiles, two LN slabs were cut from a crystal boule and lapped to final thickness of about 10 mm. The process parameters were the same as in Example 1 except where noted. One side of the first slab was coated with the solution while no coating was applied to the second so it could serve as a control. The coated slab was processed at 460° C. and the uncoated slab at 480° C. for 100 min each in subsequent furnace runs.

To measure the dissipation speed of pyro-electrically induced charges, an electric field meter (was suspended above a grounded hotplate which was held at a temperature of 35° C. A few drops of electrolyte solution were placed on the center of the hotplate to aid in establishing good thermal as well as electrical contact to the untreated bottom side of the slab. The slabs were brought to a thermal equilibrium at room temperature at 20° C.

To measure the voltage generated on the center of the slab surface, the slab to be evaluated was placed onto the hotplate and pressed down briefly to distribute the electrolyte solution across the full slab surface. The electric field on the top surface of the slab was tracked with time. The electric field measured, the surface potential (voltage) and the charge density are all proportional, and the terms are used interchangeably for discussing the results shown in FIGS. 7A-C described below.

Figure 7A:
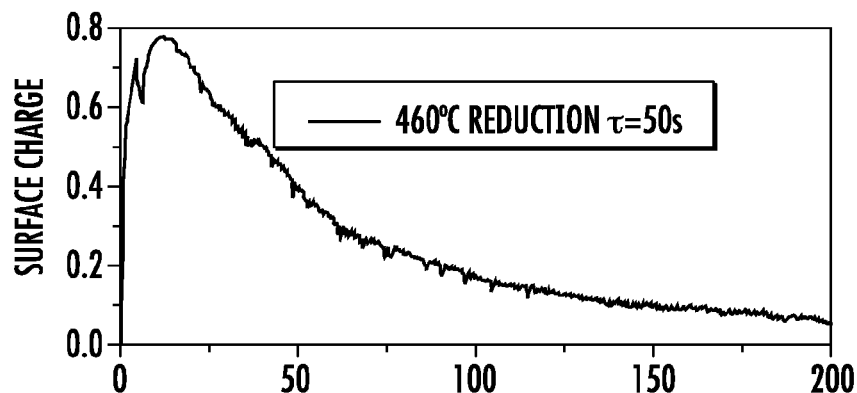
FIGS. 7A-B show measured charge dissipation curves for LN slabs processed according to a disclosed method.
Figure 7B:
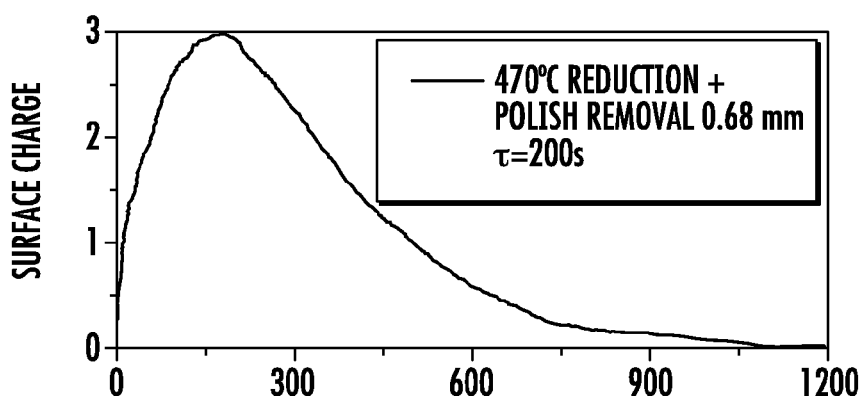
Figure 7C:
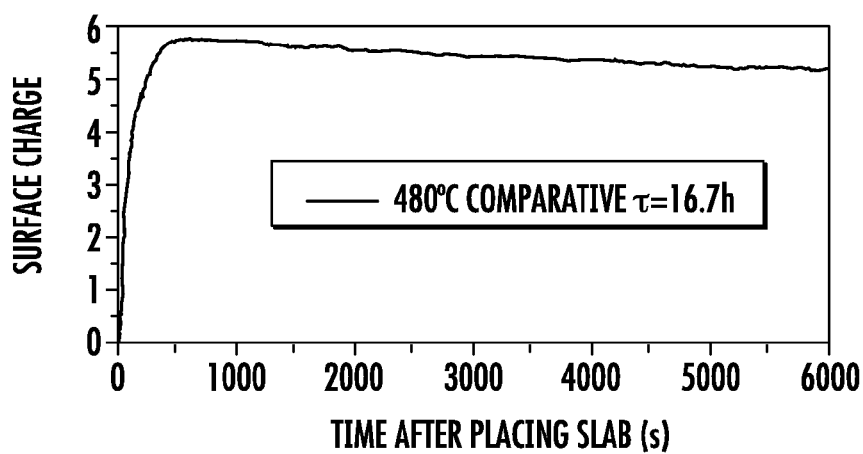
FIG. 7C shows surface charge results for a comparative sample using a known processing method.

FIG. 7A shows the surface charge on the treated surface of a LN slab that underwent steps 110 through 140. Step 130 held the slab at a temperature 460° C. for 100 minutes. FIG. 7B will be described in Example 3 below. FIG. 7C shows the surface charge on the slab that had only steps 110, 130 and 140 performed. Step 130 was done at 480° C. for 100 minutes. For all cases, there is no charge observed before the slab was placed onto the hotplate at time t=0. As the LN slab heated up, the pyro-electric charges start appearing. This charge generation happens until the whole slab volume has thermally equilibrated to 35° C., on a timescale of a minute after placing the slab. Simultaneously, the electrical conductivity in the reduction layer will bleed off charges from the top surface. The dissipation time constant can be estimated by fitting a single-exponential decay curve to the tail of the surface charge curves when the LN slab is at constant temperature. The time constant fit results are shown in FIGS. 7A-C as inserts. The annealed slabs without the active chemical treatment (FIG. 7C) can be seen to show much higher surface charge than the others with a disclosed active chemical reduction treatment (FIGS. 7A and 7B), with the differences being large enough to constitute a highly unexpected and highly favorable result.

In the comparative example, the electrical conductivity is very small, and the charge bleeds off very slowly as shown in FIG. 7C (dissipation time constant $\tau$=16.7 h). The estimated $\tau$ being over 16 hours makes the charge dissipation rate ineffective for a practical Q-switch device. It is noted that $\tau$ can only increase with surface removal from the top surface in Step 150. The $\tau$ for the slab processed according to steps 110 through 140 is only 50 s, thus on the same order as the thermal equilibration time. Because the charge dissipation already happens during the thermal equilibration time, the maximal charge appearing on the surface of the slab is much lower, only 13%, than that observed on the surface of the comparative example. This $\tau$ is short enough for most practical Q-switch applications. It is however temperature dependent (i.e., gets longer at lower temperature, activation energy 0.672 eV). Step 150 also removes some depth of the reduction profile, so the charge decay time for the finished Q-switch device will generally be slightly longer than this measurement suggests.

The performance of a disclosed Q-switch can be estimated with the data so far presented. Assume that a Q-switch is processed as described with subsequent lap/polish removal of 0.2 mm from each side. Assume one wants to calculate the 1064 nm IL and the $\tau$ of this device at relatively cold temperature of $-20°$ C. From FIG. 6, one sees that for this processing temperature, the reduction profile of the finished Q-switch device is characterized by a diffusion depth a=0.26 mm and a surface absorption value $\alpha_0$=3 cm$^{-1}$ at 633 nm (the finished device surface is what is 0.2 mm below the surface of the as-processed slab).

Using the proportionality constant 0.23 given in Example 1 for converting to 1064 nm absorption, the total expected IL can be calculated according to Eq. (12) to be 3.5%. Eq. (10) shows that the charge time constant is proportional to the distance w/2 from center to edge where the charges get removed by the electrodes. The slab had a radius of 55 mm, the Q-switch (assume 9×9×25 mm) w/2=4.5 mm. This geometry effect reduces the dissipation time roughly by a factor 0.082. The material removal depth of 0.2 mm reduces the surface electrical conductivity and correspondingly increases the dissipation time by exp$^{(0.2/0.26)}$=2.16. Finally, the lower temperature will reduce the electrical conductivity and increase the dissipation time by a factor 245 (change from 35° C. to $-20°$ C. with assumed activation energy 0.672 eV). Taking all factors into account, the final device $\tau$ is estimated at $-20°$ C. to be 36 minutes, generally short enough for practical Q-switch devices.

The $\tau$ of a Q-switch device manufactured from the comparative example slab omitting step 120 of the invention can similarly be estimated. At $-20°$ C., such a Q-switch has a $\tau$ of 614 h, or roughly one month. A Q-switch from regular production that has not undergone any reduction treatment would have a $\tau$ even longer than that. To be practically useful, a $\tau$ at $-20°$ C. should generally be 1 hour or shorter.

One possible scenario for selecting the set of values for the process parameters is outlined next. It should be clear that many variations of this scenario are possible or desirable depending on the particular process equipment and how well each process steps is controlled. First, the process parameters such as surface conditioning, condensed material composition and film thickness, heating profile, processing atmosphere and duration are chosen based on existing know-how about available processes and equipment. Next, the polish removal depth required for a pit-free optical surface is established.

As noted above, this depth should be kept small in order to achieve a high figure of merit and surface electrical conductivity, but it needs to be large enough to allow consistent polish quality and removal depth across different production batches. Once these process parameters are fixed, a few runs at varying processing temperatures in step 130 can be conducted to establish the processing temperature to achieve the desired charge decay speed in the finished Q-switch device. This selection is expected to yield different values for different laser design objectives. A very high gain laser has a tendency to lase prematurely and needs a short decay time constant. It will generally need a higher processing temperature (or alternatively one or more of: longer processing time, thicker film, higher density of active chemical, lower polish removal). According to Eq. (1), the IL will be correspondingly higher. IL's as high as 5% or 6% may still result in satisfactory power output.

A low gain laser on the other hand can tolerate more polarization distortion giving a lower contrast ratio without the risk of premature lasing. It may be best to use a Q-switch with lower surface electrical conductivity for this laser system than was optimal for the high gain system. This Q-switch will show reduced IL and thus improved laser output power. For systems that do not require very low temperature operation, the extra IL may be kept relatively small, e.g. to less than 0.5% while still giving adequate suppression of pre-lasing.

Example 3

A LN slab was cut from a crystal boule and the two opposite faces were oriented to within 3 minutes from the crystallographic Z-axis and lapped using alumina grit of 9 µm size to slab thickness of 22.4 mm (step 110). The same solution containing lithium oxalate as active chemical as described in Example 1 was deposited in a spin-coating process with a drying step after coating each of the Z-surfaces (step 120). The coated slab was then loaded into a furnace, the furnace sealed and the gas flow initiated at 1 l/min. The furnace was ramped up to 470° C., kept there for 100 minutes (step 130) and then allowed to cool naturally. The processed slab was unloaded after the furnace dropped below 60° C. and appeared quite dark at the surface (step 140). The first side (+Z side) was lapped and polished next. A total of 0.68 mm in depth was removed. This is a fairly large removal compared to the characteristic diffusion depth a and reduces the surface conductivity to a lower value than would have resulted from a more modest removal of 0.1 mm to 0.3 mm. The estimate of the diffusion depth a to 0.295 mm for this LN slab was by interpolating the result of FIG. 6 for the intermediate temperature.

The same experiment with the hotplate was performed as described in Example 2, this time with a hot plate temperature of 40° C. FIG. 7B shows the measured surface charge on the polished slab surface. The slab was about a quarter the area of the full boule cross section. Because this slab is thicker than that of Example 2, the time to have the slab reach the final temperature of the hotplate is longer and it takes almost 3 minutes to reach the peak of observed charge density. The charge decay time constant for this slab at 40° C. is around 200 s and was estimated based on data from times larger than 10 minutes. As in Example 2, one can estimate the expected time constant for charge decay of a finished device at some cold temperature, say $-20°$ C.

The smaller aperture size of the Q-switch compared to the slab decreases the expected decay time constant by a factor 2.8. The lower temperature increases it by a factor of 365, resulting in an expected Q-switch decay time of 7 hours. This is certainly much better than an untreated Q-switch, but it may not be short enough for all applications. If a lower decay time is desired, the polish removal could easily be reduced. While this decay time estimate was derived with a slab that was only lapped and polished on one side, the decay time estimate is still valid for devices processed equally on both sides. Assuming the second side is processed similarly, it will also have the same surface conductivity and since the pyro-electric charges are produced symmetrically but with opposite sign on the opposing Z-faces, the charge decay on either side has the exact same dynamics, and the center of the slab or device will always be at the same, 0V electrical potential. One can also estimate the IL from FIG. 6. At the removal depth of 0.68 mm, the surface absorption at 633 nm for a corresponding curve for a slab processed at 470° C. is about 0.5 cm$^{-1}$. Using Eq. (12) and correcting for the different wavelength, one can then estimate the IL due to the reduction to 2*0.0295 cm*0.23*0.5/cm=0.7%.

The second side of the LN slab (−Z face) was also lapped and polished, similarly removing 0.68 mm resulting in an overall slab thickness of 21.0 mm. The slab was then cut into rectangular devices with X- and Y-dimensions of 7.4 mm. These faces were left in the as-cut state even though a lapping step could be added to alter the surface roughness. The X-faces were metalized with a standard Cr adhesion layer followed by an Au layer. The optical Z-faces were anti-reflection coated with a high damage threshold coating. To avoid re-oxidizing the crystal volume containing the reduction profile, care was taken to not heat the crystal above 250° C. with oxygen present in the atmosphere. This concludes step 150 of method 100.

The transmission of a disclosed finished LN Q-switch (Serial number (SN) 58418) was measured by scanning a focused laser beam providing a wavelength of a wavelength of 633 nm across the aperture in the x-direction. The proportionality constant $\alpha(1064 \text{ nm})/\alpha(633 \text{ nm})=0.23$ was used to convert the measured values to the experimentally important wavelength of 1064 nm.

Figure 8:
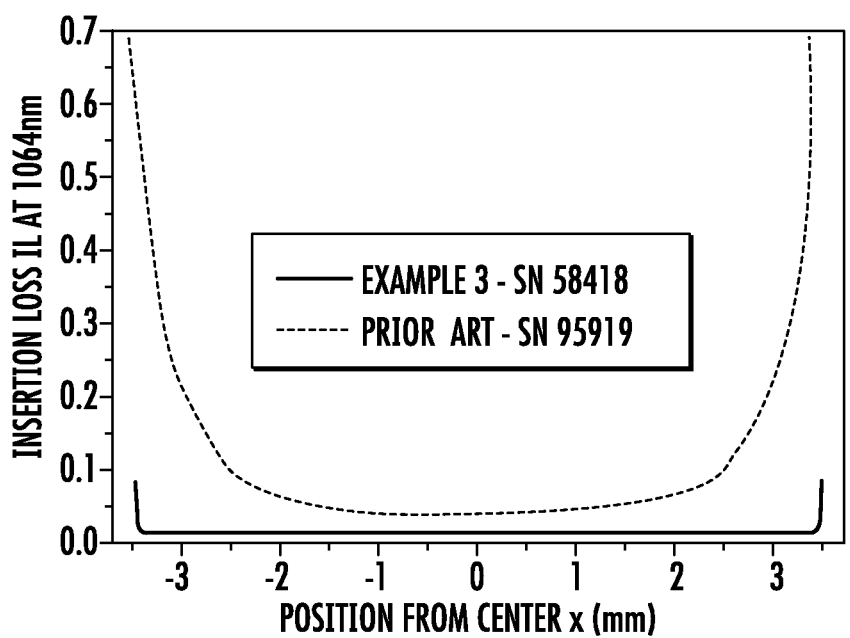
FIG. 8 shows measured optical insertion loss (IL) across the optical aperture for a disclosed chemically reduced LN Q-switch and a comparative sample using a known process.

FIG. 8 shows the IL as function of position from the center x of the Z-face (see point 3 which lies at the center of the −Z face 1 in FIG. 1) which defines the overall transmission. A 633 nm wavelength laser was focused with a 100 mm focal length lens, and the resulting beam diameter at the Q-switch location was about 0.1 mm. The transmission values were measured at fixed time intervals while the Q-switch was moved at constant speed. Given the speed and sampling rate, the separation between neighboring recordings and plots as shown in FIG. 8 evaluates to 0.006 mm. While this results in each measurement overlapping with 16 of its neighboring measurements, one can for example pick ever 17th point, and arrive at a set of 61 evenly spaced measurements with non-overlapping beams across the 6.3 mm aperture. The total IL measured is 1% and shows very little variation, less than 0.5% across the aperture. Because of residual reflection loss of the AR coatings, typically specified at less than 0.25% per surface, it was concluded that the IL due to the reduction profile is less than 1%, in agreement with the 0.7% estimate provided above. The fall-off shown at the edges is due to beam clipping.

The transmission of a comparative example LN Q-switch with SN 95919 is also shown. This Q-switch was prepared by annealing a regular production Q-switch of dimensions 7.4×7.4×21 mm and annealing it for 100 minutes at 475° C. in the same 3.5% hydrogen atmosphere. The center IL of this comparative sample, labeled "Prior Art" in FIG. 8, is 3.8%. It can be seen that the reduction profile of this known sample is highly non-uniform across the active aperture. Across an active aperture, defined as a circle with diameter 6.3 mm, the IL varies from 3.8% at the center to 29% towards the edges. As evidenced in FIG. 8, disclosed Q-switches on the other hand allow manufacture of Q-switches with optical IL having variation about a magnitude lower than the IL at the center of the aperture. The "prior art" method results in much larger non-uniformity, a factor of 6.6 in the measured sample, evidencing a highly unexpected and favorable result for disclosed Q-switches.

During typical electro-optic Q-switch operation, a high voltage is periodically applied to the metalized X-faces. A conductivity path between these electrodes potentially causes problems by shorting out the applied field in extreme cases or by causing charge migration leading to a change over time in voltage necessary to achieve operating condition. The currents drawn by three Q-switches were measured under application of a sinusoidal varying voltage with 3,000V amplitude and frequency of 10 MHz. A third sample, a Q-switch from regular production (no reduction, fully oxidized), SN 814707 with identical dimensions to SN 95919, was also measured. From the known dielectric constant, the Inventor calculated the capacitance to be about 18 pF with corresponding imaginary Impedance of 0.88 TΩ. The measured imaginary Impedances were 0.82, 0.90, and 0.64 TΩ for samples 58418, 814707, and 95919, in reasonable agreement with expectation. The real part of the impedance, a measure of charge flow through the LN sample, was measured to 1.54 TΩ, 1.4 TΩ, and −0.13 TΩ for the same samples. While the sample produced according to the invention shows no discernible difference in conductivity from the untreated Q-switch, sample 95919 with the non-uniform reduction profile shows a ten-fold current level.

The minus sign indicates that at the probed frequency of 10 MHz, the current flowing through that sample is in the opposite direction from what is expected for Ohmic behavior. While the measured resistance is still very high and will not influence the operation of the power supply, the implied charge migration may indicate possible problems with drift of the half-wave voltage over long periods of time.

Example 4

A LN slab was cut from a crystal boule and the two opposite faces were oriented to within 3 minutes from the crystallographic Z-axis and lapped using alumina grit of 9 μm size to slab thickness of 21.6 mm (step 110). The spin-coating and furnace run was performed as in Example 3, but to a processing temperature of 450° C. instead of 470° C. Both faces were then lightly lapped and polished. The first side underwent a total removal of 0.29 mm, the second side 0.30 mm.

The slab was then cut into rectangular devices with X- and Y-dimensions of 7.4 mm using the same process as described above in Example 3. Again, the X-faces were metalized followed by the optical anti-reflection coating of the Z-faces. To reverse the effect of a possible re-oxidization during AR coating, the decision of step was chosen to be "yes", and step 170 was also performed. The same furnace as in steps 130 and 140 was used with the same gas flow and ramp rates. The annealing temperature was chosen 50° C. below that of step 130, 400° C. and the dwell time was reduced to 1 hour. This lower temperature will not significantly alter the original diffusion profile, but it should reverse a possible oxidation that might have happened during the polish and AR coating processing in a shallow surface layer.

To arrive at a rough estimate of the worst case change in diffusion profile, it is noted that the sample certainly did not exceed 300° C. in any of the steps 150. The original diffusion profile is estimated to about 0.2 mm from the data shown in FIG. 6 assuming an Arrhenius dependence. Extrapolating this dependence to the lower temperatures of 300° C. and 400° C. gives estimates of 0.005 and 0.07 mm for the coating and anneal processes, respectively. Even if it is assumed that the re-oxidation was complete at the surface in one of the steps 150 and no new charge carriers are produced in the annealing step 170 at the surface and the necessary charges required to replenish shallow layer are all taken from the original reduction profile, it was estimated that the surface conductivity is restored to at least 80% of the original value. Because re-oxidization is likely incomplete at the surface and occurs at a lower temperature than the assumed 300° C., the actual surface conductivity is expected to be within 10% of the original value after completing step 140. After the completion of annealing processing 170, the sample, SN 61184, was characterized. The IL at 1064 nm was determined to be about 1.4% above that of a comparative sample (SN 60826) that was also polished and AR coated but had only undergone process steps 110 and 150.

Both those Q-switches were then characterized for charge dissipation at low temperature. The device under test was mounted in a temperature-controlled chamber so that a laser of wavelength 1064 nm could be passed through the crystal. Nitrogen gas was flowed into the chamber to avoid condensation on optical surfaces. A polarizer before the chamber ensured good polarization purity of the incident beam.

The laser beam with diameter of 1 mm was centered on the crystal aperture and a Wollaston prism after the chamber separated the output beam into two beams of different polarization. Using two optical power meters, both the transmitted power at the original polarization and the power at the orthogonal polarization could be measured. The chamber with no crystal achieved an extinction ratio (defined as $10*\log(P_{original}/P_{orthogonal})$) in excess of 45 dB. Any de-polarization will be observed as a decrease in extinction ratio because the birefringence induced in the crystal will increase the power coupled into the orthogonal polarization.

The measurement proceeded by first heating the crystal to +60° C. and holding it there for a few hours to let possible pyro-electric charges dissipate. The crystal tilt was then adjusted, while maintaining a constant temperature, to align the Z-axis with the laser beam. This maximizes the extinction ratio for a given Q-switch, typically achieving 40 dB or better. The next phase of the experiment consisted of several iterations of dropping the crystal temperature by 20° C. below the previous temperature and tracking the extinction ratio during this transition period as well as one to two hours after the crystal had reached the new temperature. Sample SN 61184 and the untreated sample (no reduction, SN 80826) were evaluated and the results are shown in FIGS. 9A-D.

Figure 9A:
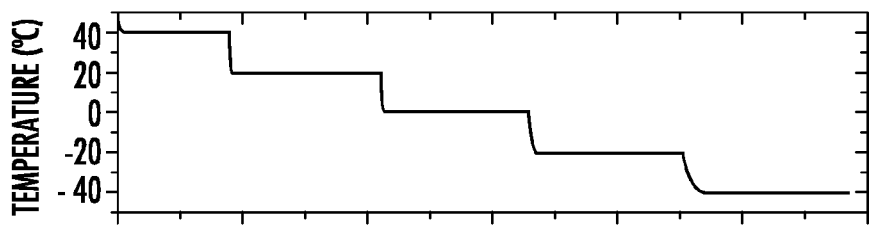
FIGS. 9A-B show the applied temperature profile and resulting extinction ratio of a disclosed Q-switch processed according to an example method.
Figure 9B:
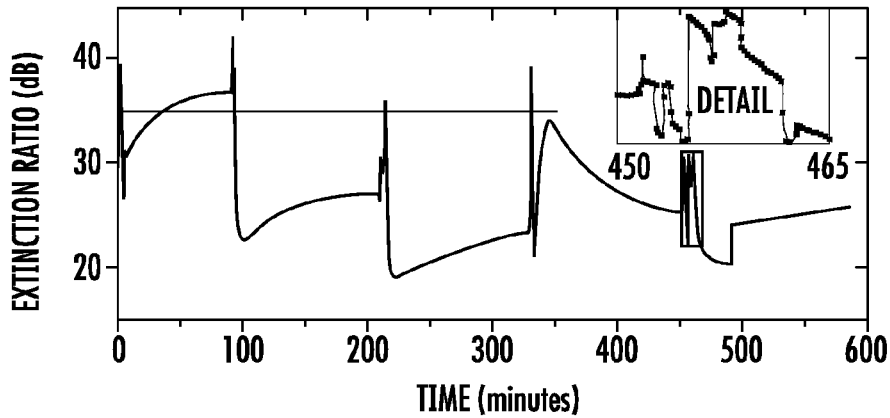

FIGS. 9A and 9B show the temperature and extinction ratio of SN 80826, the comparative example, as a function of time. The observed extinction ratio drops below 20 dB during the run. While the extinction ratio recovers well to about 37 dB for the sample at temperature +40° C., this is not the case for lower sample temperatures. A dashed line indicates the value of 35 dB for reference. The Q-switch does not attain this extinction ratio any time after its temperature falls below 20° C. The step-wise transients observed in extinction ratio, e.g. in the 15 minute time interval starting at 450 minutes, are from discharge events that suddenly change the surface charge distribution. A rectangular box in the main graph outlines this time period and the same data is shown in FIG. 9B in the insert labeled "detail". Many of these discharge events decrease rather than increase the extinction ratio, a sign that the surface charge density is quite uneven and unpredictable. At a temperature of -20° C. for example, the extinction ratio deteriorates rather than improves for most of the soak duration, a clear indication that the change in extinction ratio is not due to the desired uniform draining of the charges.

Figure 9C:
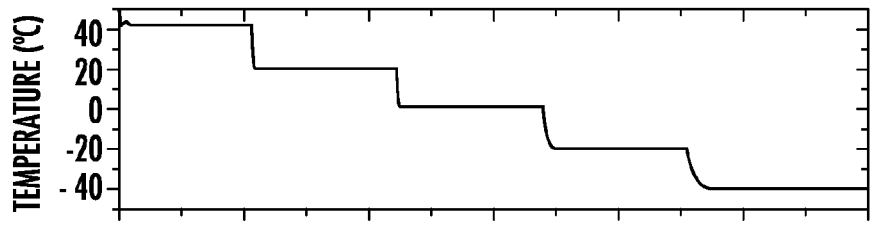
FIGS. 9C-D show the equivalent data for a comparative sample using a known processing method.
Figure 9D:
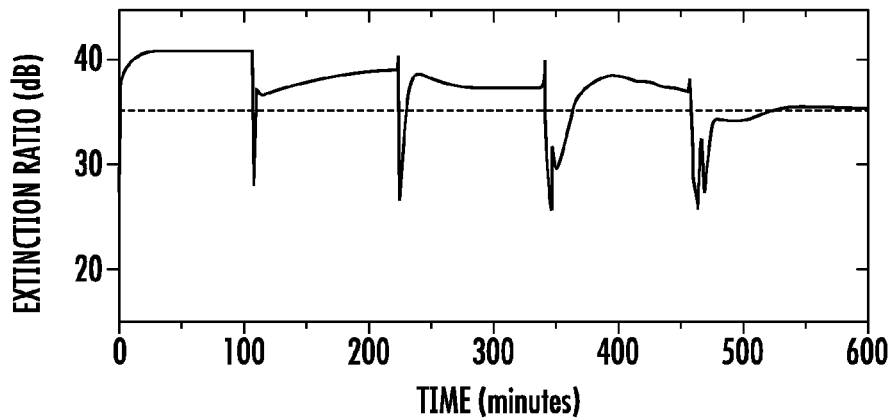

FIGS. 9C and 9D show the temperature and extinction ratio of Sample SN 61184, produced with a disclosed method. While the extinction ratio deteriorates during the short periods where the sample temperature changes rapidly, it starts to recover as soon as a constant temperature is achieved. A 35 dB extinction or better is achieved after charges are given sufficient time to dissipate. For the transition from 0° C. to -20° C., the time for the Q-switch to reach this extinction ratio is 23 minutes after the ramp was started. At -40° C., the recovery takes longer, about 60 minutes. A better recovery could be achieved by the same processing but at slightly increased processing temperature for step 130. This would result in a higher surface conductivity and increased profile depth. The IL would also increase. It will be appreciated by those skilled in the art that this temperature can be optimized for a particular laser design. Modest gain laser systems likely will tolerate an IL of up to 3%.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, the AR coating of the Z-surfaces can be eliminated if one were to cut and polish the Q-switch at Brewster's angle. The treated surfaces would no longer be Z-faces, but be rotated by tens of degrees.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed:

1. A Q-switch device, comprising:
 a chemically reducible electro-optic lithium compound crystal (LC) substrate including a chemically reduced first Z-surface and a chemically reduced second Z-surface opposite said first Z-surface;
 metal electrodes on opposing sides of said LC substrate orthogonal to said first Z-surface and said second Z-surface, and
 an antireflective (AR) coating material on said first Z-surface and said second Z-surface,
 wherein said first Z-surface and said second Z-surface includes a surface layer under said AR coating material that is chemically reduced to an extent to provide a 25° C. electrical conductivity that is at least ten thousand times ($10^4$) greater than an intrinsic electrical conductivity of said LC substrate, and
 wherein said Q-switch device has a charge decay time constant shorter than 1 hour at -20° C.

2. The Q-switch device of claim 1, wherein said LC substrate comprises Lithium Niobate (LN) and said 25° C. electrical conductivity is greater than or equal to $1 \times 10^{-12}$ $ohm^{-1} \cdot cm^{-1}$.

3. The Q-switch device of claim 1, wherein said LC substrate comprises Lithium Tantalate (LT).

4. The Q-switch device of claim 1, wherein said Q-switch device has an insertion loss (IL) less than 3%.

5. The Q-switch device of claim 1, wherein said AR coating material comprises a metal oxide.

6. The Q-switch device of claim 1, wherein said first Z-surface and said second Z-surface provide an insertion loss (IL) uniformity of <0.5, wherein said IL uniformity is given by:

$$\Delta IL = (\max(IL) - \min(IL))/IL_{ctr},$$

wherein said $IL_{ctr}$ stands for an IL measurement at a center of an active aperture on said first Z-surface and said second Z-surface, and said max and min are a maxima and minima IL from a plurality of other IL measurements measured on said active aperture with a beam size at least 0.1 mm and smaller than a quarter of a size of said active aperture so that said plurality of other IL measurements do not overlap one another or said IL measurement at said center and sample at least two locations within each quadrant of said active aperture.

* * * * *